(12) United States Patent
Yotsuya et al.

(10) Patent No.: US 7,387,739 B2
(45) Date of Patent: Jun. 17, 2008

(54) MASK AND METHOD OF MANUFACTURING THE SAME, ELECTROLUMINESCENT DEVICE AND METHOD OF MANUFACTURING THE SAME, AND ELECTRONIC INSTRUMENT

(75) Inventors: Shinichi Yotsuya, Suwa (JP); Kazushige Umetsu, Chino (JP); Daisuke Sawaki, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 963 days.

(21) Appl. No.: 10/412,323

(22) Filed: Apr. 14, 2003

(65) Prior Publication Data

US 2004/0026360 A1 Feb. 12, 2004

(30) Foreign Application Priority Data

Apr. 17, 2002 (JP) ............................. 2002-114682

(51) Int. Cl.
*B44C 1/22* (2006.01)
*H01L 21/00* (2006.01)
(52) U.S. Cl. ............................. 216/17; 216/41; 216/83; 438/745; 438/753; 428/131; 430/5; 430/313; 219/121.71
(58) Field of Classification Search ................ 216/17, 216/41, 2, 83; 438/745, 753; 428/131; 430/5, 430/313; 219/121.71
See application file for complete search history.

(56) References Cited

U.S. PATENT DOCUMENTS

| 4,961,821 | A | * | 10/1990 | Drake et al. ................ 438/21 |
| 6,059,981 | A | * | 5/2000 | Nakasuji ......................... 216/2 |
| 6,235,626 | B1 | | 5/2001 | Makino et al. |
| 6,365,058 | B1 | * | 4/2002 | Beatty et al. .................. 216/27 |
| 6,893,575 | B2 | * | 5/2005 | Yotsuya ......................... 216/12 |
| 2003/0054646 | A1 | * | 3/2003 | Yotsuya ....................... 438/689 |

FOREIGN PATENT DOCUMENTS

| JP | A 4-236758 | 8/1992 |
| JP | A 2001-185350 | 7/2001 |
| JP | A 2002-004034 | 1/2002 |

OTHER PUBLICATIONS

U.S. Appl. No. 10/246,731, filed Sep. 19, 2002, Yotsuya.
U.S. Appl. No. 10/247,570, filed Sep. 20, 2002, Yotsuya.
U.S. Appl. No. 10/247,360, filed Sep. 20, 2002, Yotsuya.

* cited by examiner

*Primary Examiner*—Shamim Ahmed
(74) *Attorney, Agent, or Firm*—Oliff & Berridge, PLC

(57) ABSTRACT

A plurality of penetrating holes are formed in a substrate, each of the penetrating holes connecting a first opening and a second opening larger than the first opening. An etching resistant film is formed on a first surface of the substrate avoiding areas in which the first openings will be formed, part of the second surface in which the penetrating holes are formed being exposed so as to expose areas each of which includes two or more of the second openings. Small holes are formed in the formation regions for each of the penetrating holes. Etching having crystal orientation dependence is performed from both the first and second surfaces of the substrate.

8 Claims, 5 Drawing Sheets

FIG. 1A
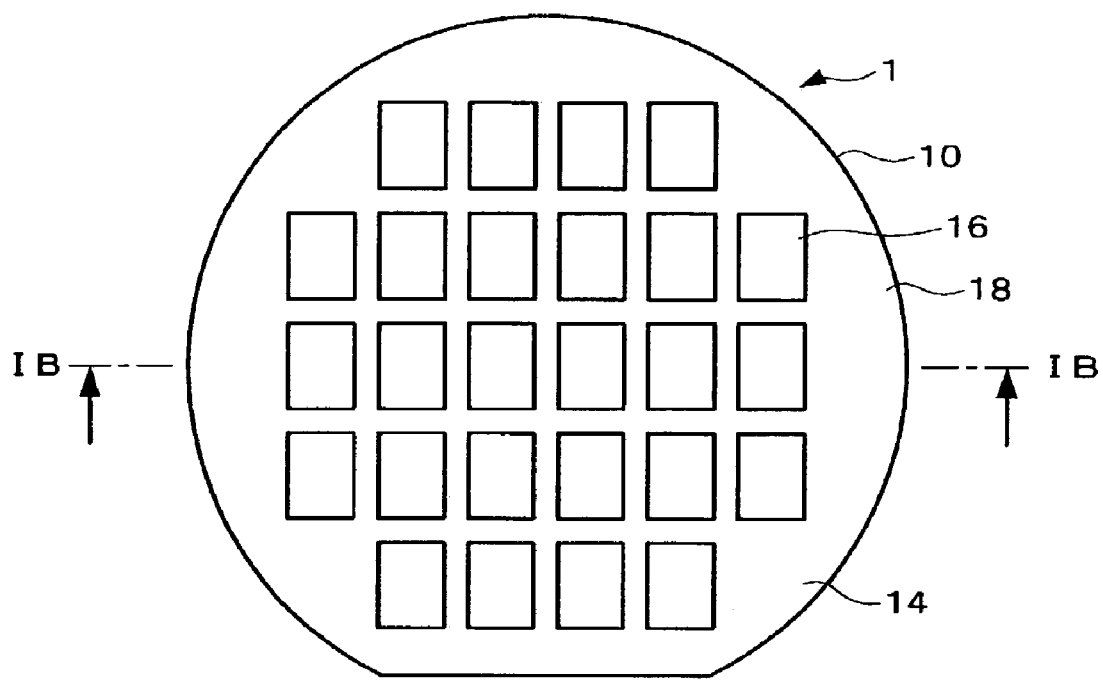
FIG. 1B
FIG. 2
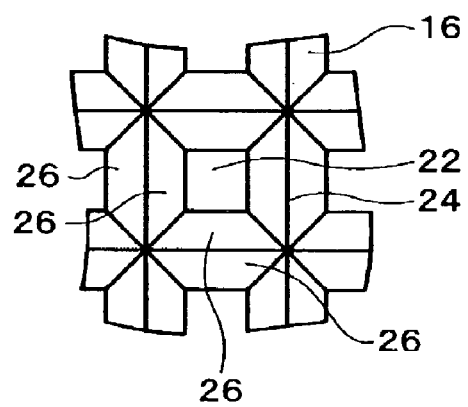

MASK AND METHOD OF MANUFACTURING THE SAME, ELECTROLUMINESCENT DEVICE AND METHOD OF MANUFACTURING THE SAME, AND ELECTRONIC INSTRUMENT

Japanese Patent Application No. 2002-114682 filed on Apr. 17, 2002, is hereby incorporated by reference in its entirety.

BACKGROUND OF THE INVENTION

The present invention relates to a mask and a method of manufacturing the mask, an electroluminescent device and a method of manufacturing the electroluminescent device, and an electronic instrument.

A high precision mask has been demanded. In the manufacturing process of a color organic electroluminescent (hereinafter abbreviated as "EL") device, an organic material of each color is evaporated by using a mask, for example. A pattern of penetrating holes is formed on the mask. If the inner wall surfaces of the penetrating holes are tapered and the material is evaporated in the direction from the side of large openings to the side of small openings, the amount of evaporation particles incident upon the penetrating holes can be increased, whereby a fine pattern corresponding to the small openings can be evaporated. As a method of manufacturing a mask having such tapered penetrating holes, etching a substrate utilizing crystal orientation dependence has been known. In this etching method, if etching is started from the side of small openings, etching stops halfway due to crystal orientation dependence. Therefore, etching is started from the side of large openings, and an etching resistant film is formed on the side of large openings.

However, when it is difficult to form the etching resistant film on the side of large openings, this method cannot be applied in practice. Moreover, it is difficult to precisely determine the position and shape of small openings since etching proceeds from the large openings. Furthermore, since the etching resistant film is formed on the side of large openings, the interval between adjacent openings is increased, making it difficult to improve the mask precision.

BRIEF SUMMARY OF THE INVENTION

According to a first aspect of the present invention, there is provided a method of manufacturing a mask including formation of a plurality of penetrating holes in a substrate, each of the penetrating holes connecting a first opening and a second opening larger than the first opening, the method comprising:

(a) forming an etching resistant film on a first surface of the substrate avoiding areas in which the first openings will be formed, and exposing areas in which the penetrating holes will be formed in a second surface of the substrate opposite to the first surface so as to expose areas each of which includes two or more of the second openings;

(b) forming smaller holes than the penetrating holes at positions in which the penetrating holes will be formed; and (c) etching the first and second surfaces of the substrate with crystal orientation dependence.

According to a second aspect of the present invention, there is provided a mask manufactured by the above method.

According to a third aspect of the present invention, there is provided a mask comprising a substrate in which a plurality of penetrating holes are formed, wherein:

each of the penetrating holes has inclined inner wall surfaces and connects a first opening and a second opening larger than the first opening; and each of the penetrating holes is partitioned from at least one adjacent penetrating hole only by the inner wall surfaces on the side of the second openings.

According to a fourth aspect of the present invention, there is provided a method of manufacturing an electroluminescent device comprising depositing a luminescent material by using any one of the above-described masks.

According to a fifth aspect of the present invention, there is provided an electroluminescent device manufactured by the above method.

According to a sixth aspect of the present invention, there is provided an electronic instrument comprising the above electroluminescent device.

BRIEF DESCRIPTION OF THE SEVERAL VIEWS OF THE DRAWING

FIGS. 1A and 1B are views showing a mask according to a first embodiment of the present invention.

FIG. 2 is a partially enlarged view of the mask according to the first embodiment of the present invention.

DETAILED DESCRIPTION OF THE EMBODIMENT

Figure 3A:
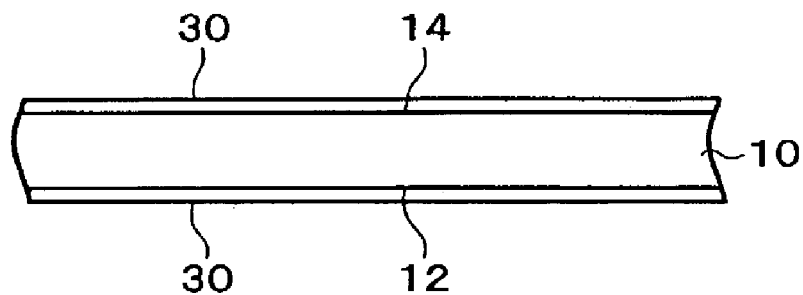
FIGS. 3A to 3E are views illustrating a method of manufacturing the mask according to the first embodiment of the present invention.

An objective of embodiments of the present invention is to manufacture a high precision mask.

(1) According to one embodiment of the present invention, there is provided a method of manufacturing a mask including formation of a plurality of penetrating holes in a substrate, each of the penetrating holes connecting a first opening and a second opening larger than the first opening, the method comprising:

(a) forming an etching resistant film on a first surface of the substrate avoiding areas in which the first openings will be formed, and exposing areas in which the penetrating holes will be formed in a second surface of the substrate opposite to the first surface so as to expose areas each of which includes two or more of the second openings;

(b) forming smaller holes than the penetrating holes at positions in which the penetrating holes will be formed; and (c) etching the first and second surfaces of the substrate with crystal orientation dependence.

According to the method of manufacturing a mask of the present invention, areas in the second surface of the substrate in which the penetrating holes are formed are exposed, so that the mask can be manufactured irrespective of difficulty in forming an etching resistant film on the second surface. Moreover, since the etching resistant film is formed on the first surface of the substrate avoiding areas in which the first openings are formed, the first openings (smaller than the second openings) can be formed to have precise position and shape. Furthermore, since areas each of which includes two or more of the second openings are exposed on the second surface in which the second openings (larger than the first openings) are formed, the interval between adjacent second openings can be reduced, whereby the mask precision can be improved.

(2) In this method of manufacturing a mask, the smaller holes than the penetrating holes may be formed by applying one of laser processing, microblast processing, time-modulated plasma etching, and machining.

(3) In this method of manufacturing a mask, a solution in which tetramethylammonium hydroxide is dissolved in an amount of 10 to 30 wt % may be used for etching with crystal orientation dependence.

(4) In this method of manufacturing a mask, in the step (a), the etching resistant film may be also formed on the second surface avoiding areas in which the penetrating holes are formed.

According to this feature, since areas covered with the etching resistant film are not etched and thick areas of the substrate remain, a mask having high strength can be manufactured.

(5) In this method of manufacturing a mask, the step (c) may be performed after the step (b), and the smaller holes than the penetrating holes may be enlarged by etching with crystal orientation dependence in the step (c).

(6) In this method of manufacturing a mask, the step (c) may be performed before and after the step (b);

etching may be performed with crystal orientation dependence before the step (b) on both the first and second surfaces of the substrate until the etching stops at least on the first surface; and the smaller holes than the penetrating holes may be enlarged by etching with crystal orientation dependence after the step (b).

According to this feature, the substrate can be made thinner by etching the areas in which the penetrating holes are formed before forming the smaller holes than the penetrating holes. Therefore, the smaller holes than the penetrating holes can be easily formed.

(7) In this method of manufacturing a mask, the substrate may be a single crystal silicon substrate;

each of the first and second surfaces of the substrate may have Miller indices {100};

inner wall surfaces of the penetrating holes may have Miller indices {111}; and the crystal orientation dependence in the etching may be a property in which an etching rate for the {111} planes is lower than etching rates for planes having Miller indices other than {111}.

(8) In this method of manufacturing a mask, the etching in the step (c) may be terminated after all surfaces of the substrate exposed from the etching resistant film become {111} planes.

(9) According to one embodiment of the present invention, there is provided a mask manufactured by the above method.

(10) According to one embodiment of the present invention, there is provided a mask comprising a substrate in which a plurality of penetrating holes are formed, wherein:

each of the penetrating holes has inclined inner wall surfaces and connects a first opening and a second opening larger than the first opening; and each of the penetrating holes is partitioned from at least one adjacent penetrating hole only by the inner wall surfaces on the side of the second openings.

According to the mask of the present invention, since the interval between adjacent second openings is small, the mask pattern precision is improved.

(11) In this mask, the substrate may be a single crystal silicon substrate; and the inner wall surfaces of the penetrating holes may have Miller indices {111}.

(12) According to one embodiment of the present invention, there is provided a method of manufacturing an electroluminescent device comprising depositing a luminescent material by using any one of the above masks.

(13) According to one embodiment of the present invention, there is provided an electroluminescent device manufactured by the above method.

(14) According to one embodiment of the present invention, there is provided an electronic instrument comprising the above electroluminescent device.

The embodiments of the present invention are described below with reference to the drawings.

First Embodiment

FIGS. 1A and 1B are views showing a mask according to a first embodiment of the present invention. FIG. 1B is a cross-sectional view taken along the line IB-IB shown in FIG. 1A. FIG. 2 is a partially enlarged view of FIG. 1A. A mask 1 has a substrate (or a single crystal substrate, for example) 10. Alternatively, the mask 1 could be formed of only a substrate (or a single crystal substrate, for example) 10. The substrate 10 may be a single crystal silicon substrate or a silicon wafer. Opposite surfaces (first and second surfaces 12 and 14) of the substrate 10 may have Miller indices {100}. Note that the {100} planes include a plurality of planes equivalent to the (100) plane. In a cubic lattice, directions perpendicular to the {100} planes are <100> directions.

The substrate 10 includes at least one thin section 16. A plurality of thin sections 16 may be arranged in matrix. The substrate 10 has a thick section 18 in addition to the thin sections 16. The thick section 18 keeps the strength of the substrate 10. The thin sections 16 are formed to avoid the edge of the substrate 10. The thick section 18 may be formed on the edge of the substrate 10. If the thin sections 16 are surrounded by the thick section 18, the thin sections 16 are rarely deformed.

The thin sections 16 are positioned close to the first surface 12 (or one of the surfaces) in the direction of the thickness of the substrate 10. In other words, the thin sections 16 are bottoms of depressed sections formed on the second surface 14 (or a surface opposite to the first surface 12) of the substrate 10. In the substrate 10, the thin sections 16 and the area other than the thin sections 16 (thick section 18) are level on a surface (or the first surface 12) opposite to the surface in which the depressed sections are formed (or the second surface 14).

A plurality of penetrating holes 20 are formed in the substrate 10. The penetrating holes 20 constitute the thin section 16. Specifically, one thin section 16 consists of a group of the penetrating holes 20. Each of the penetrating holes 20 connects first and second openings 22 and 24. The first openings 22 are formed in the first surface 12, and the second openings 24 are formed in the second surface 14. The second openings 24 are larger than the first openings 22. The first and second openings 22 and 24 may be in the shape of a polygon such as a square or a rectangle, a circle, or an ellipse. The shapes of the first and second openings 22 and 24 may be similar or different.

Inner wall surfaces 26 of the penetrating holes 20 are at an oblique angle to at least one of the first and second surfaces 12 and 14 of the substrate 10. The inner wall surfaces 26 may be flat. In this embodiment, the inner wall surfaces 26 are {111} planes. In the case where the substrate 10 is a single crystal silicon substrate and the first surface 12 is a {100} plane, the angle formed by the inner wall surfaces 26 and the first surface 12 is 54.7°. Each of the penetrating holes 20 is partitioned from at least one of the adjacent penetrating holes 20 only by the inner wall surfaces 26 on the side of the second surface 14. In other words, only a corner section formed by the inner wall surfaces 26 is present between adjacent penetrating holes 20 on the side of the second surface 14. According to this configuration, since the interval between adjacent second openings 24 is reduced, the pattern precision of the mask 1 is improved.

FIGS. 3A to 3E are views illustrating a method of manufacturing a mask according to the first embodiment of the present invention. In this embodiment, the substrate 10 is provided in a state before the penetrating holes 20 and others are formed. The substrate 10 may be a single crystal silicon substrate or a silicon wafer, for example. The substrate 10 has a surface having Miller indices {100} such as opposite surfaces (first and second surfaces 12 and 14). At least one of the first and second surfaces 12 and 14 of the substrate 10 may be mirror-ground in advance.

As shown in FIG. 3A, an etching resistant film 30 is formed on the substrate 10 (to a thickness of about 1 μm, for example). The etching resistant film 30 is formed on at least the first surface 12 of the substrate 10, and may also be formed on the second surface 14. The etching resistant film 30 may be formed to continuously cover the entire surface (including side surfaces at the edges of the first and second surfaces 12 and 14) of the substrate 10. The etching resistant film 30 may be formed by using silicon oxide obtained by thermal oxidation (such as wet thermal oxidation), silicon nitride, or silicon carbide. The etching resistant film 30 maybe a silicon nitride film formed by CVD, or a gold or chromium film formed by sputtering.

Figure 3B:
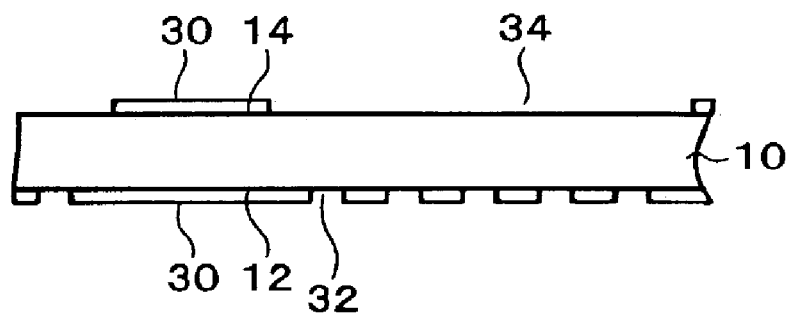

The etching resistant film 30 is formed on the first surface 12 of the substrate 10 avoiding areas in which the first openings 22 of the penetrating holes 20 will be formed. For example, a plurality of first etching openings 32 are formed in the etching resistant film 30 on the first surface 12, as shown in FIG. 3B. The first etching openings 32 are located to correspond to the first openings 22 to be formed, and may have the same shape as the first openings 22. In each of the first etching openings 32, part of the first surface 12 is exposed. Each of these exposed areas on the side of the first surface 12 will not include two or more adjacent penetrating holes 20.

In the second surface 14 of the substrate 10, areas in which the penetrating holes 20 will be formed are exposed so as to expose areas each of which will includes two or more of the second openings. In the case of forming the etching resistant film 30 on the second surface 14, one or more second etching openings 34 are formed in the etching resistant film 30. The second etching openings 34 correspond to areas in which the thin sections 16 shown in FIG. 1A are formed, and may have the same shape as the thin sections 16. If the etching resistant film 30 is formed also on the second surface 14, part of the first and second surfaces 12 and 14 covered by the etching resistant films 30 will not etched. In this case, thick part of the substrate 10 remains, so the mask 1 having high strength can be manufactured.

Each of the first etching openings 32 is included in a region (or a projected region) of one of the second etching openings 34. Photolithography and etching (such as wet etching using an aqueous solution of fluoborate and ammonium fluoride) may be applied for forming the first and second etching openings 32 and 34.

Figure 3C:
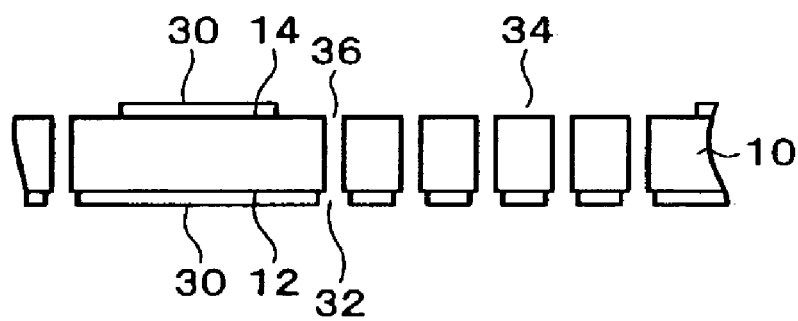

As shown in FIG. 3C, holes 36 (hereinafter called "small holes") smaller than the penetrating holes 20 are formed in the areas in which the penetrating holes 20 will be formed. The small holes 36 may be formed by applying any of laser (such as YAG laser or $CO_2$ laser) processing, microblast processing (in which fine abrasives are blasted by a jet), time-modulated plasma etching (in which formation of sidewall protective films and etching are alternately performed), and machining using a drill or the like. The small holes 36 are respectively formed in the first etching openings 32 on the first surface 12.

Figure 3D:
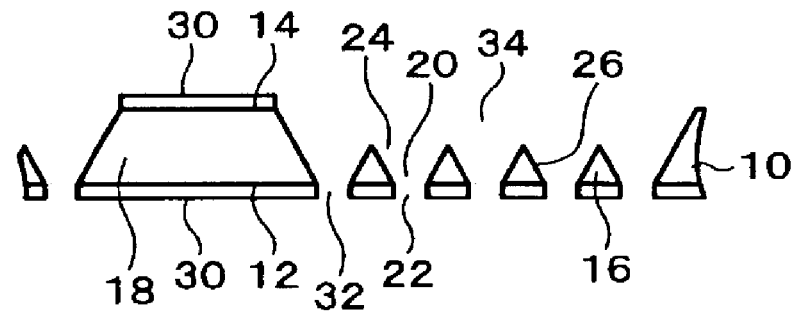

As shown in FIG. 3D, etching is started from both sides of the first and second surfaces 12 and 14 of the substrate 10 using the etching resistant films 30 as masks. Since etching is performed after forming the small holes 36, the small holes 36 are enlarged by etching. In this embodiment, etching may have crystal orientation dependence in which the etching rate of the {111} plane is (10 times or more, and preferably 100 times or more, for example) lower than the etching rates of the {100} plane and the {110} plane, for example.

Such etching may be performed by using an organic amine type alkaline aqueous solution such as a solution in which tetramethylammonium hydroxide is dissolved in an amount of 10 to 30 wt % (in particular, about 10 to 20 wt %), and heating the solution up to about 80° C. An inorganic alkaline aqueous solution other than a potassium hydroxide aqueous solution, such as aqueous ammonia, may also be used. Use of an alkaline solution containing neither potassium nor sodium prevents the mask 1 from being contaminated during the manufacture of the mask 1, whereby contamination of a TFT substrate or the like which is an object of evaporation can be prevented during evaporation using the mask 1. The present invention does not exclude etching using potassium. For example, a 15% potassium hydroxide solution may be heated at about 80° C. and used for etching.

FIG. 3D illustrates an example in which the substrate 10 is a silicon substrate, the first and second surfaces 12 and 14 being the {100} planes, and etching having crystal orientation dependence in which the etching rate of the {111} plane is (10 times or more, and preferably 100 times or more, for example) lower than the etching rates of the {100} plane and the {110} plane is performed.

In this case, the {100} plane exposed in the first etching openings 32 is etched on the first surface 12, whereby the small holes 36 are enlarged. Enlargement of the small holes 36 by etching stops at the first etching openings 32 in the etching resistant film 30. The {100} plane exposed in the second etching openings 34 is etched on the second surface 14. Since regions between the adjacent small holes 36 are also exposed on the second surface 14, the {100} plane is also etched in these regions. The thin sections 16 can be formed on the substrate 10 in this manner. Etching is terminated after all the surfaces of the substrate 10 exposed from the etching resistant film 30 become the {111} planes.

Figure 3E:
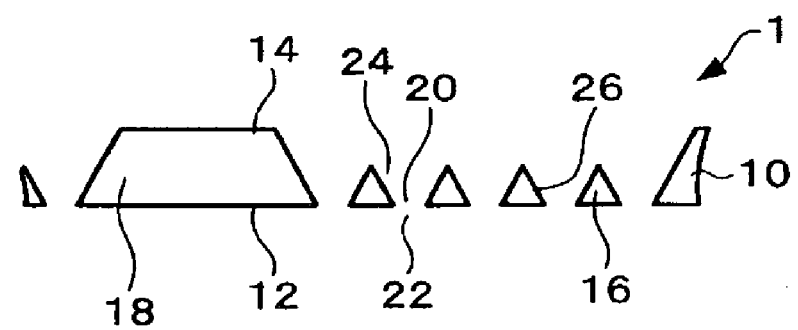

The penetrating holes 20 can be formed in this manner. In the example shown in FIG. 3D, all the inner wall surfaces of the penetrating holes 20 are formed by the {111} planes. If necessary, the etching resistant films 30 are removed as shown in FIG. 3E. In the case where the etching resistant film 30 is formed of an insulator, adhesion of particles due to static electricity can be prevented by removing the etching resistant film 30. The substrate 10 may optionally be cut by dicing or the like. The mask 1 shown in FIG. 1 can be manufactured by these steps.

According to this embodiment, since areas in which the penetrating holes 20 will be formed are exposed on the second surface 14 of the substrate 10, the mask 1 can be manufactured irrespective of difficulty in forming the etching resistant film 30 on the second surface 14. Moreover, since the etching resistant film 30 is formed on the first surface 12 of the substrate 10 avoiding the areas in which the first openings 22 will be formed, the position and shape of the first openings 22 (smaller than the second openings 24) can be precisely determined. Furthermore, since areas in each of which two or more of the second openings 24 (larger than the first openings 22) will be formed are exposed on the second surface 14, the interval between adjacent second openings 24 can be reduced, whereby precision of the mask 1 can be improved.

Second Embodiment

Figure 4A:
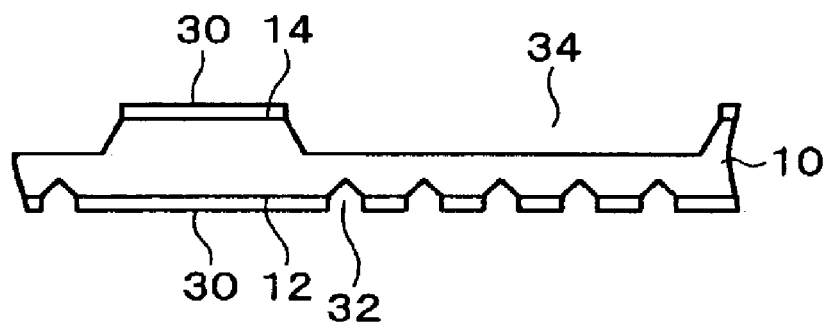
FIGS. 4A and 4B are views illustrating a method of manufacturing a mask according to a second embodiment of the present invention.
Figure 4B:
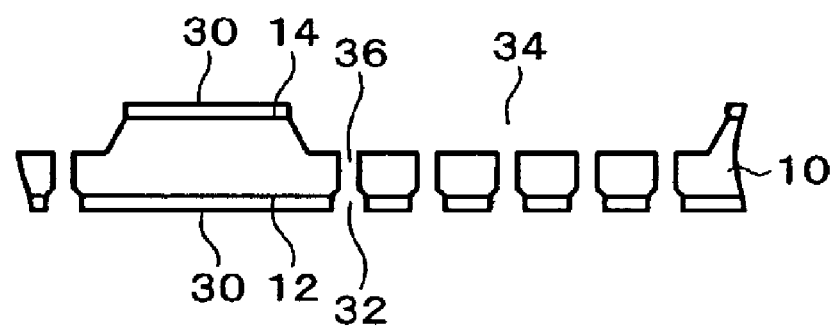

FIGS. 4A and 4B are views illustrating a method of manufacturing a mask according to a second embodiment of the present invention. In this embodiment, the steps shown in FIGS. 3A and 3B are performed. Specifically, the etching resistant films 30 are formed on the first and second surfaces 12 and 14 of the substrate 10, the first etching openings 32 are formed in the etching resistant film 30 on the first surface 12, and the second etching openings 34 are formed in the etching resistant film 30 on the second surface 14.

A step shown in FIG. 4A is then performed. Specifically, etching having crystal orientation dependence is performed from both the first and second surfaces 12 and 14 of the substrate 10. The etching may be performed by using an organic amine type alkaline aqueous solution such as a solution in which tetramethylammonium hydroxide is dissolved in an amount of 10 to 30 wt % (in particular, about 10 to 20 wt %), and heating the solution at about 80° C. An inorganic alkaline aqueous solution other than a potassium hydroxide aqueous solution, such as aqueous ammonia, may also be used. Use of an alkaline solution containing neither potassium nor sodium prevents the mask 1 from being contaminated during the manufacture of the mask 1, whereby contamination of a TFT substrate or the like which is an object of evaporation can be prevented during evaporation using the mask 1. The present invention does not exclude etching using potassium. For example, a 15% potassium hydroxide solution may be heated at about 80° C. and used for etching.

FIG. 4A illustrates an example in which the substrate 10 is a silicon substrate, the first and second surfaces 12 and 14 being the {100} planes, and etching having crystal orientation dependence in which the etching rate of the {111} plane is (10 times or more, and preferably 100 times or more, for example) lower than the etching rates of the {100} plane and the {110} plane is performed. On the first surface 12, the first etching openings 32 are partitioned corresponding to areas in which the penetrating holes 20 will be formed, each exposed area is small. Therefore, etching stops at the {111} planes. Since the second etching openings 34 are formed to correspond to areas in each of which two or more of the penetrating holes 20 will be formed, so that each exposed area is large. Therefore, etching proceeds deeply, whereby the substrate 10 can be made thinner. Etching is performed while managing the solution temperature and time. Etching may be performed until etching stops at least on the first surface 12.

As shown in FIG. 4B, the small holes 36, which are smaller than the penetrating holes 20, are formed in areas in which the penetrating holes 20 will be formed (or within the first etching openings 32). In this embodiment, since the small holes 36 are formed after making the substrate 10 thinner, the small holes 36 can be formed by applying time-modulated plasma etching (in which formation of sidewall protective films and etching are alternately performed), or machining using a drill or the like. Other features are the same as the features described in the first embodiment with reference to FIG. 3C.

The succeeding steps are the same as the steps described in the first embodiment with reference to FIGS. 3D and 3E. Specifically, the small holes 36 are enlarged by etching having crystal orientation dependence. In this embodiment, the mask 1 shown in FIG. 3E can also be manufactured. Other features are the same as described in the first embodiment.

Third Embodiment

Figure 5:
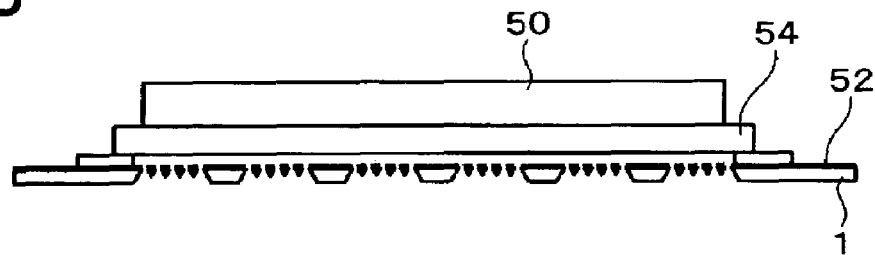
FIG. 5 is a view illustrating a method of manufacturing an EL device according to a third embodiment of the present invention.

FIG. 5 is a view illustrating a method of manufacturing an EL device according to a third embodiment of the present invention. A magnetic film 52 is formed on the mask 1 shown in FIG. 5. The magnetic film 52 may be formed by using a ferromagnetic material such as iron, cobalt, or nickel. The magnetic film 52 may be formed by using a magnetic metal material such as Ni, Co, Fe, or a stainless alloy containing an Fe component, or combinations of a magnetic metal material and a non-magnetic metal material. Other details of the mask 1 are the same as described in the first and second embodiments.

Figure 6A:
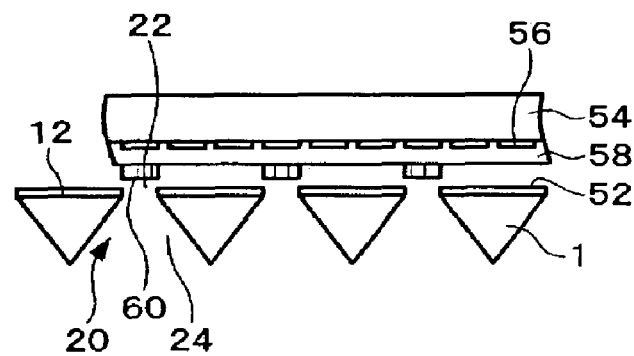
FIGS. 6A to 6C are views illustrating a method of depositing luminescent materials.

In this embodiment, luminescent materials are deposited on a substrate 54 by using the mask 1. The substrate 54 is a transparent substrate such as a glass substrate used for an EL device (organic EL device, for example). As shown in FIG. 6A, an electrode (transparent electrode formed of ITO or the like, for example) 56 and a hole transport layer 58 are formed on the substrate 54. An electron transport layer may also be formed. The mask 1 is disposed so that the first surface 12 in which the first openings 22 are formed faces the substrate 54. Specifically, the flat surface of the mask 1 faces the substrate 54. A magnet 50 is disposed on the back side of the substrate 54 so as to attract the magnetic film 52 formed on the mask 1. Therefore, if warping of the mask 1 occurs, the warping can be corrected.

Figure 6B:
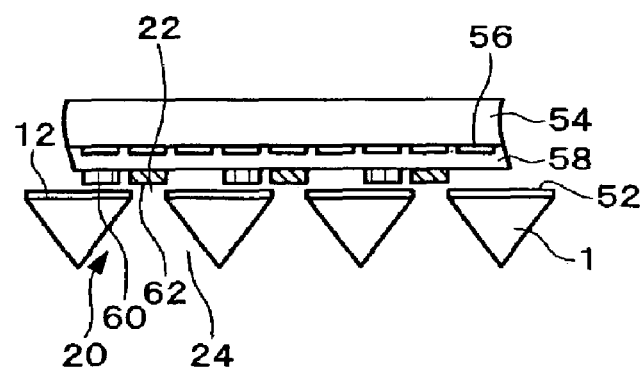
Figure 6C:
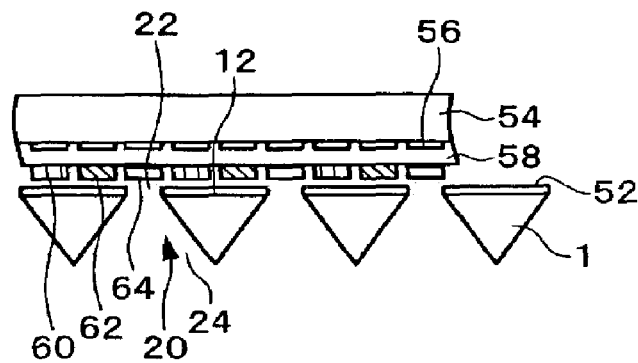

FIGS. 6A to 6C are views illustrating a method for depositing the luminescent materials. The luminescent materials are organic materials, for example. As a low-molecular-weight organic material, a quinolinol aluminum complex ($Alq_3$) can be given. As a high-molecular-weight organic material, poly(p-phenylene vinylene) (PPV) can be given. The luminescent materials may be deposited by evaporation. As shown in FIG. 6A, a red luminescent material is deposited through the mask 1 while patterning to form red luminescent layers 60. As shown in FIG. 6B, the mask 1 is moved and a green luminescent material is deposited while patterning to form green luminescent layers 62. As shown in FIG. 6C, the mask 1 is moved again and a blue luminescent material is deposited while patterning to form blue luminescent layers 64.

Figure 7:
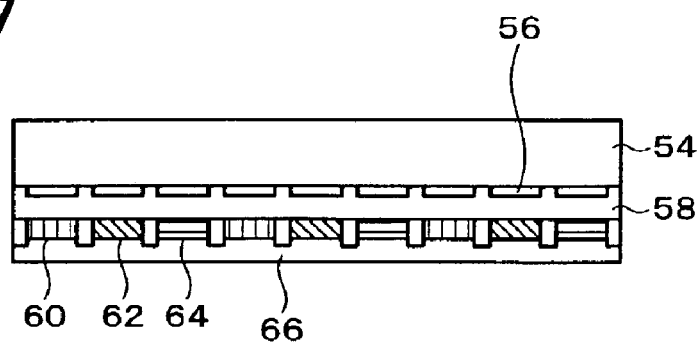
FIG. 7 is a view showing the EL device according to the third embodiment of the present invention.

FIG. 7 is a view showing an EL device manufactured by using the above-described deposition method for the luminescent materials. The EL device (organic EL device, for example) includes the substrate 54, electrodes 56, hole transport layer 58, luminescent layers 60, 62, and 64, and the like. An electrode 66 is formed on the luminescent layers 60, 62, and 64. The electrode 66 is a cathode electrode, for example. The EL device (EL panel) becomes a display device (display).

Figure 8:
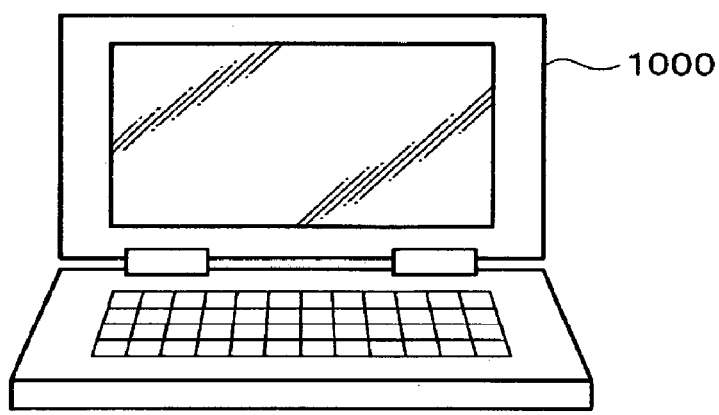
FIG. 8 is a view showing an electronic instrument according to one embodiment of the present invention.
Figure 9:
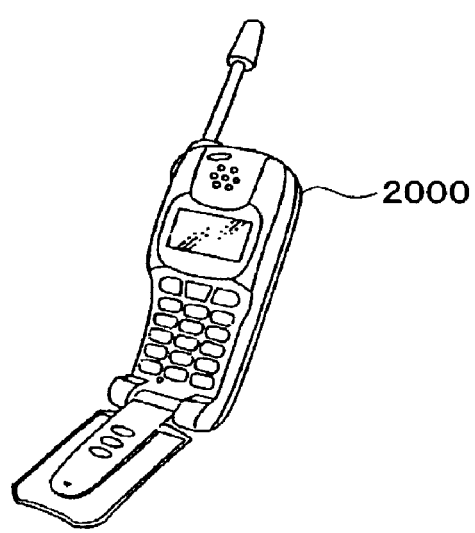
FIG. 9 is a view showing another electronic instrument according to one embodiment of the present invention.

FIGS. 8 and 9 respectively show a notebook-type personal computer 1000 and a portable telephone 2000 as examples of an electronic instrument including the EL device according to the embodiment of the present invention.

The present invention is not limited to the above-described embodiments, and various modifications can be made. For example, the present invention includes various other configurations substantially the same as the configurations described in the embodiments (in function, method and effect, or in objective and effect, for example). The present invention also includes a configuration in which an unsubstantial portion in the described embodiments is replaced. The present invention also includes a configuration having the same effects as the configurations described in the embodiments, or a configuration able to achieve the same objective. Further, the present invention includes a configuration in which a publicly known technique is added to the configurations in the embodiments.

What is claimed is:

1. A method of manufacturing a mask including formation of a plurality of penetrating holes in a substrate, each of the penetrating holes connecting one of first openings and one of second openings that are larger than the first openings respectively, the method comprising:
    (a) forming an etching resistant film on a first surface of the substrate avoiding areas in which the first openings will be formed, and exposing regions in each of which two or more of the penetrating holes will be formed in a second surface of the substrate opposite to the first surface so as to continuously expose areas for forming two or more of the second openings in each of the regions;
    (b) forming smaller holes than the penetrating holes at positions in which the penetrating holes will be formed; and
    (c) etching the first and second surfaces of the substrate with crystal orientation dependence.

2. The method of manufacturing a mask as defined in claim 1,
    the smaller holes than the penetrating holes being formed by applying one of laser processing, microblast processing, time-modulated plasma etching, and machining.

3. The method of manufacturing a mask as defined in claim 1,
    a solution in which tetramethylammonium hydroxide is dissolved in an amount of 10 to 30 wt % being used for etching with crystal orientation dependence.

4. The method of manufacturing a mask as defined in claim 1,
    in the step (a), the etching resistant film being also formed on the second surface avoiding areas in which the penetrating holes are formed.

5. The method of manufacturing a mask as defined in claim 1:
    the step (c) being performed after the step (b); and
    the smaller holes than the penetrating holes being enlarged by etching with crystal orientation dependence in the step (c).

6. The method of manufacturing a mask as defined in claim 1:
    the step (c) being performed before and after the step (b);
    etching being performed with crystal orientation dependence before the step (b) on both the first and second surfaces of the substrate until the etching stops at least on the first surface; and
    the smaller holes than the penetrating holes being enlarged by etching with crystal orientation dependence after the step (b).

7. The method of manufacturing a mask as defined in claim 1:
    the substrate being a single crystal silicon substrate;
    each of the first and second surfaces of the substrate having Miller indices {100};
    inner wall surfaces of the penetrating holes having Miller indices {111}; and
    the crystal orientation dependence in the etching is a property in which an etching rate for the {111} planes being lower than etching rates for planes having Miller indices other than {111}.

8. The method of manufacturing a mask as defined in claim 7,
    the etching in the step (c) being terminated after all surfaces of the substrate exposed from the etching resistant film become {111} planes.

* * * * *